US006256184B1

(12) United States Patent
Gauthier Jr. et al.

(10) Patent No.: US 6,256,184 B1
(45) Date of Patent: Jul. 3, 2001

(54) METHOD AND APPARATUS FOR PROVIDING ELECTROSTATIC DISCHARGE PROTECTION

(75) Inventors: Robert J. Gauthier Jr., Hinesburg; Edward J. Nowak, Essex Junction; Steven H. Voldman, South Burlington; Richard Q. Williams, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/334,088

(22) Filed: Jun. 16, 1999

(51) Int. Cl.[7] .......... H02H 3/22

(52) U.S. Cl. .......... 361/111; 361/56; 361/91.5

(58) Field of Search .......... 361/56, 91.1, 111, 361/91.5

(56) References Cited

U.S. PATENT DOCUMENTS 5,086,365 * 2/1992 Lien .......... 361/58
5,479,039 * 12/1995 Lien .......... 257/356
5,528,188 6/1996 Au et al. .
5,530,612 6/1996 Maloney .
5,598,313 1/1997 Gersbach .
5,646,809 7/1997 Motley et al. .
5,703,747 12/1997 Voldman et al. .
5,740,000 4/1998 Stackhouse et al. .
5,789,784 8/1998 Chang et al. .
5,793,592 8/1998 Adams et al. .
5,811,857 9/1998 Assaderaghi et al. .
5,815,354 9/1998 Braceras et al. .

* cited by examiner

*Primary Examiner*—Michael J. Sherry
(74) *Attorney, Agent, or Firm*—Schmeiser, Olsen & Watts; Eugene I. Shkurko

(57) ABSTRACT

An ESD protection method and apparatus are provided for an IC chip having an I/O pad and I/O circuitry coupled to the I/O pad. A low threshold voltage FET is coupled to the I/O pad in parallel with the I/O circuitry for protecting the IC chip from an ESD event on the I/O pad. The FET also is coupled to a first voltage terminal of the I/O circuitry for providing a shunting path for the ESD event, thereby effectuating the protecting of the IC chip from the ESD event on the I/O pad. A first control circuit is coupled to a gate of the FET for maintaining the gate at a voltage level below a threshold voltage of the FET, thereby maintaining the FET in an off state during normal operation of the IC chip. Preferably a second control circuit is coupled between the FET and the first voltage terminal and operates in conjunction with the first control circuit for maintaining the FET in an off state during normal operation of the IC chip. The first control circuit preferably comprises a short circuit between the gate of the FET and the first voltage terminal, an inverter coupled between the gate of the FET and a second voltage terminal or a negative bias generator coupled to the gate of the FET. The second control circuit preferably comprises a short circuit between the FET and the first voltage terminal or a diode coupled between the FET and the first voltage terminal.

16 Claims, 5 Drawing Sheets

METHOD AND APPARATUS FOR PROVIDING ELECTROSTATIC DISCHARGE PROTECTION

FIELD OF THE INVENTION

The present invention relates to integrated circuits, and more particularly to a method and apparatus for providing electrostatic discharge protection for integrated circuits.

BACKGROUND OF THE INVENTION

Techniques for protecting integrated circuits from large, undesirable current and voltage signals due to electrostatic discharges, over-voltage conditions and the like (hereinafter "ESD events") are well known. For example, each input/output (I/O) pad of an integrated circuit typically is provided with a diode coupled between the I/O pad and a reference terminal (e.g., ground) and a diode coupled between the I/O pad and a voltage terminal (e.g., $V_{dd}$). In response to an ESD event that generates a large positive voltage on the I/O pad, the diode coupled between the I/O pad and the voltage terminal conducts and dissipates the large positive voltage from the I/O pad to the voltage terminal. However, the diode coupled between the reference terminal and the I/O pad is reverse biased and does not conduct in response to the positive voltage on the I/O pad (i.e., no direct path is generated between the I/O pad and the reference terminal).

Because no direct path exists between the I/O pad and the reference terminal for dissipating large positive voltages present on the I/O pad, the only path for dissipating such voltages from the I/O pad to the reference terminal is a path from the I/O pad to the voltage terminal (via the diode coupled therebetween), and from the voltage terminal to the reference terminal via the IC chip capacitance. The effectiveness/efficiency of this indirect voltage dissipation path depends sensitively on the IC chip's capacitance and the resistance of the voltage terminal bus. When either the IC chip's capacitance is small or the voltage terminal bus is highly resistive, poor ESD protection is afforded by the path from the I/O pad to the voltage terminal and from the voltage terminal to the reference terminal. Accordingly, a need exists for an improved method and apparatus for providing electrostatic discharge protection for integrated circuits, particularly for ESD events that generate large positive voltages on the I/O pads of IC chips.

SUMMARY OF THE INVENTION

To overcome the needs of the prior art, a novel ESD protection method and apparatus are provided for an IC chip having an I/O pad and I/O circuitry coupled to the I/O pad. Specifically, a low threshold voltage FET (e.g., a zero threshold voltage FET) is coupled to the I/O pad in parallel with the I/O circuitry for protecting the IC chip from an ESD event on the I/O pad. The FET also is coupled to a first voltage terminal (e.g., a reference terminal) of the I/O circuitry for providing a shunting path for the ESD event, thereby effectuating the protecting of the IC chip from the ESD event on the I/O pad. A first control circuit is coupled to a gate of the FET for maintaining the gate at a voltage level below a threshold voltage of the FET, thereby maintaining the FET in an off state during normal operation of the IC chip. Preferably a second control circuit is coupled between the FET and the first voltage terminal and operates in conjunction with the first control circuit for maintaining the FET in an off state during normal operation of the IC chip.

The first control circuit preferably comprises a short circuit between the gate of the FET and the first voltage terminal, an inverter coupled between the gate of the FET and a second voltage terminal (e.g., $V_{dd}$) or a negative bias generator coupled to the gate of the FET. The second control circuit preferably comprises a short circuit between the FET and the first voltage terminal or a diode (e.g., an ESD rated diode) coupled between the FET and the first voltage terminal.

By employing the inventive method and apparatus for providing ESD protection, a direct path may be created between an I/O pad and a reference terminal for the dissipation of ESD events that generate positive voltages. IC chips having a small capacitance or a highly resistive voltage terminal bus thereby may be protected during ESD events. Further, because of the high substrate resistance associated with low or zero threshold voltage FETs, the ESD protection device turns on at lower trigger voltage levels than is possible with normal FETs.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1A:
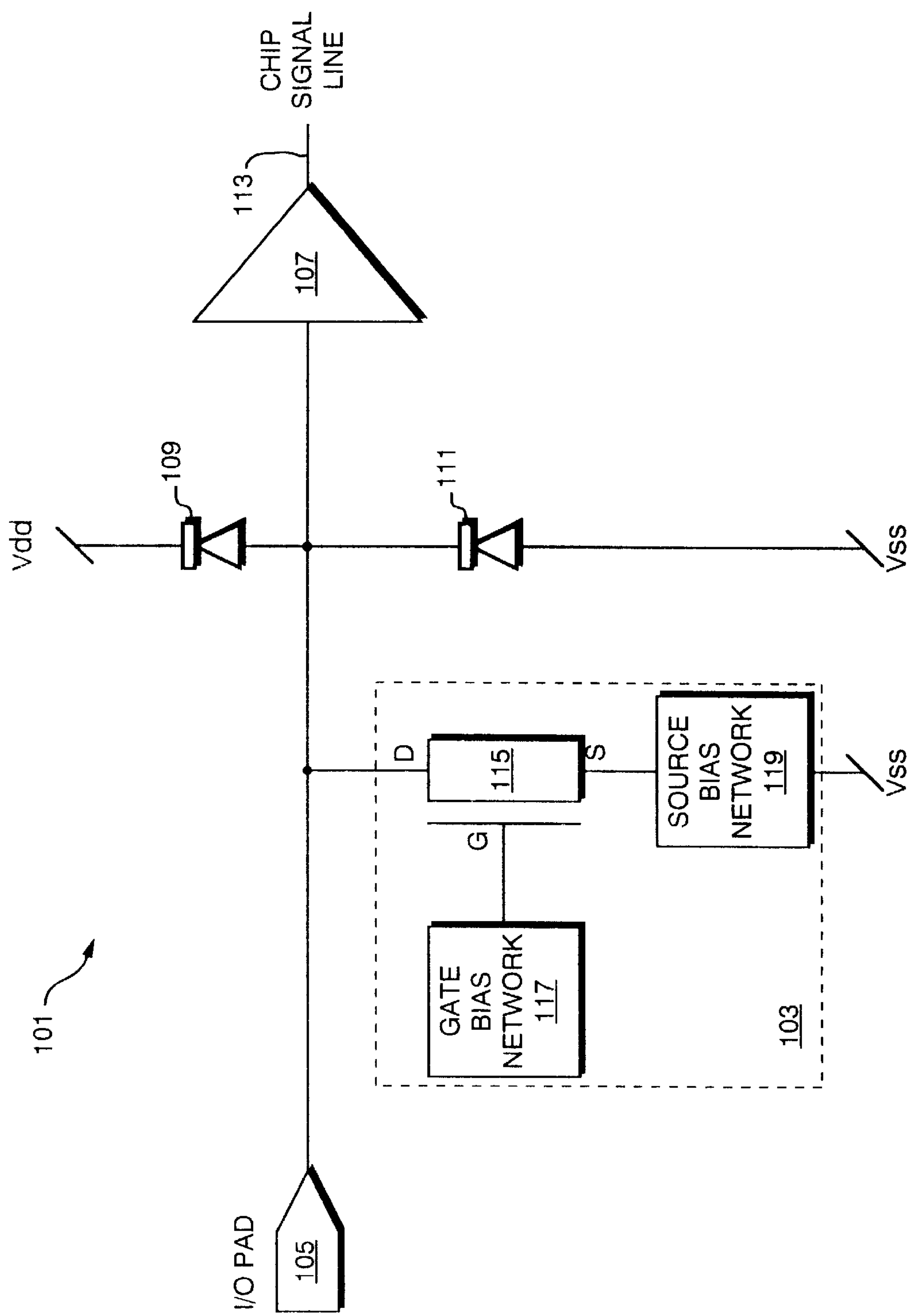
FIG. 1A is a schematic diagram of an integrated circuit chip that employs an inventive ESD protection circuit in accordance with the present invention.

FIG. 1A is a schematic diagram of an integrated circuit (IC) chip 101 that employs an inventive ESD protection circuit 103 in accordance with the present invention. The IC chip 101 comprises an input/output (I/O) pad 105 coupled to an input of an input buffer 107, to a voltage terminal ($V_{dd}$) via a first diode 109 and to a reference terminal ($V_{SS}$) (e.g., ground) via a second diode 111. The output of the input buffer 107 is coupled to a chip signal line 113 of the IC chip 101. The ESD protection circuit 103 comprises a zero threshold voltage n-channel metal-oxide-semiconductor field-effect transistor (NFET) 115, a gate bias network 117 coupled to a gate of the zero threshold voltage NFET 115 and a source bias network 119 coupled to a source of the zero threshold voltage NFET 115. The drain of the zero threshold voltage NFET 115 is coupled to the I/O pad 105.

During normal operation, the voltage of the I/O pad 105 preferably ranges from about 0 to 1.8 volts, and the gate bias network 117 and the source bias network 119 ensure that the gate-to-source voltage ($V_{GS}$) of the zero threshold voltage NFET 115 remains negative. Accordingly, the zero threshold voltage NFET 115 is OFF during normal operation of the IC chip 101. For example, if a "normal" voltage level (e.g., 0 or 1.8 volts) is input to the I/O pad 105, the voltage level is output to the chip signal line 113 of the IC chip 101 (via the input buffer 107) without being affected by the ESD protection circuit 103. Similarly, an output buffer (not shown) may be coupled between the chip signal line 113 and the I/O pad 105 to allow normal voltage levels present on the chip signal line 113 to be output from the I/O pad 105 without being affected by the ESD protection circuit 103.

During an ESD event, the first diode 109 of the IC chip 101 provides ESD protection (e.g., ESD current dissipation) between the I/O pad 105 and the voltage terminal ($V_{dd}$) when a large positive voltage is present on the I/O pad 105. Similarly, the second diode 111 of the IC chip 101 provides ESD protection between the I/O pad 105 and the reference terminal ($V_{SS}$) when a large negative voltage is present on the I/O pad 105. However, absent the ESD protection circuit 103, no direct path exists within the IC chip 101 for the dissipation of large positive voltages from the I/O pad 105 to the reference terminal ($V_{SS}$). That is, absent the ESD protection circuit 103, the only path for dissipating a large positive voltage from the I/O pad 105 to the reference terminal ($V_{SS}$) is the path from the I/O pad 105 to the voltage terminal ($V_{dd}$) via the first diode 109 and from the voltage terminal ($V_{dd}$) to the reference terminal ($V_{SS}$) via a capacitive path through the IC chip 101 (not shown). As previously described, a current dissipation path that depends on chip capacitance often does not provide effective ESD protection on small chips. However, as described below with reference to FIG. 1B, with the ESD protection circuit 103 present, a direct path exists between the I/O pad 105 and the reference terminal ($V_{SS}$) for the dissipation of positive voltage ESD events.

Figure 1B:
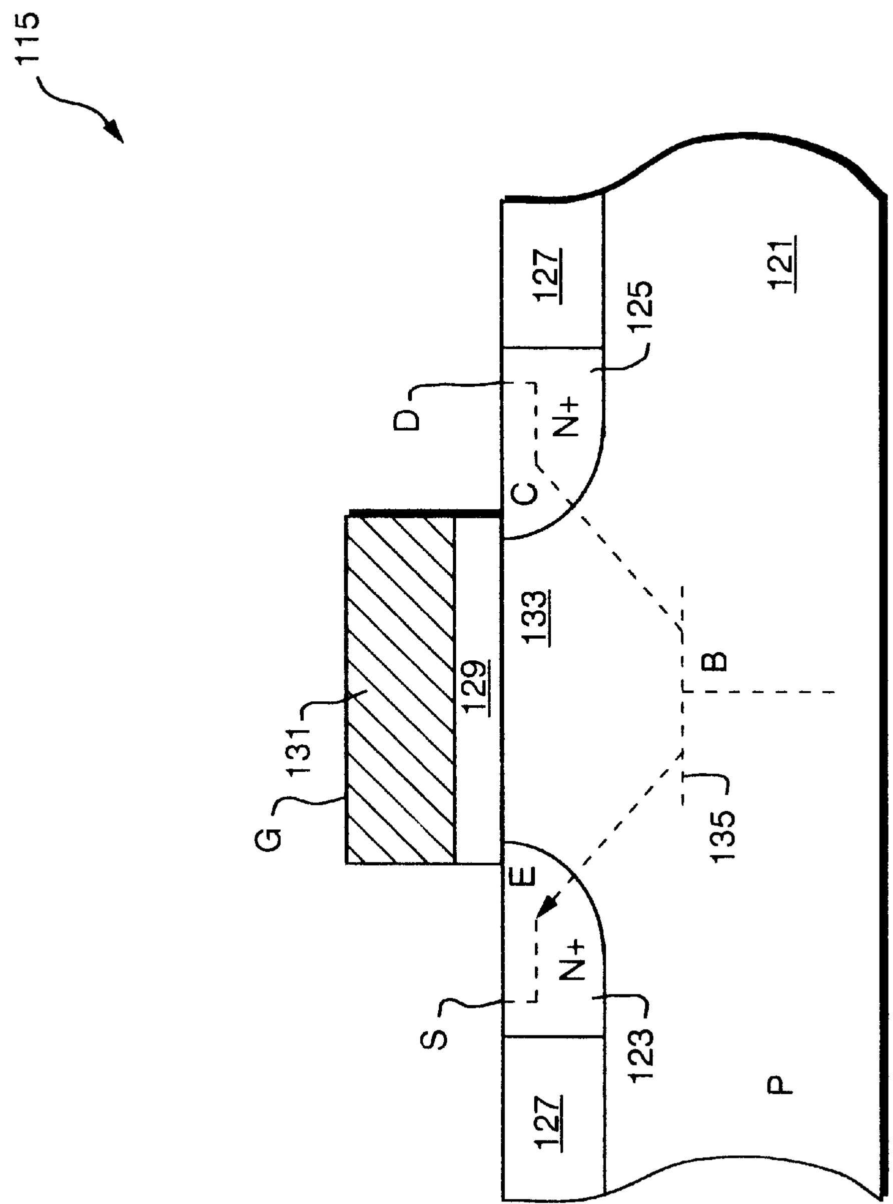
FIG. 1B is a cross-sectional view of a typical zero threshold voltage NFET employable within the inventive ESD protection circuit of FIG. 1A.

FIG. 1B is a cross-sectional view of a typical zero threshold voltage NFET 115. The zero threshold voltage NFET 115 comprises p-type substrate 121 having a first n+ diffusion region 123 and a second n+ diffusion region 125 formed therein that serve as a source and drain, respectively, of the zero threshold voltage NFET 115. The first n+ diffusion region 123 and the second n+ diffusion region 125 are surrounded by isolation oxidation regions 127 as shown to isolate the zero threshold voltage NFET 115 from other devices formed on the p-type substrate 121 (not shown).

A gate oxide 129 (e.g., silicon dioxide) and a gate 131 (e.g., polysilicon) are formed over a region 133 of the p-type substrate 121 that serves as the channel of the zero threshold voltage NFET 115. The NFET 115 is a zero threshold voltage NFET because conventional threshold voltage adjusting implants are not performed during fabrication of the NFET 115. Accordingly, the threshold voltage for the zero threshold voltage NFET 115 typically is about 0–50 millivolts.

From FIG. 1B it can be seen that a parasitic npn transistor 135 (shown in phantom) is formed within the zero threshold voltage NFET 115. The parasitic npn transistor 135 has a collector-base junction formed by the second n+ diffusion region 125 and a base-emitter junction formed by the first n+ diffusion region 123. The base of the parasitic npn transistor 135 is formed from the p-type substrate 121.

Under normal operating conditions, the p-type substrate 121 of the zero threshold voltage NFET 115 typically is grounded and/or is tied to the zero threshold voltage NFET 115's source lead. As such, the base-emitter junction of the parasitic npn transistor 135 cannot be forward biased, and the parasitic npn transistor 135 cannot turn ON. Also, if the zero threshold voltage NFET 115 is ON, the source and drain of the NFET 115 are connected by a conducting channel. However, if a sufficiently large drain voltage is applied to the drain of the zero threshold voltage NFET 115 when the zero threshold voltage NFET 115 is OFF (e.g., when no conducting channel connects the source and drain of the zero threshold voltage NFET 115), an avalanche current may flow from the drain of the zero threshold voltage NFET 115 through the p-type substrate 121 to the source. If sufficient in magnitude, the avalanche current can generate a sufficient voltage potential within the p-type substrate 121 (e.g., the base of the parasitic npn transistor 135) to forward bias the base-emitter junction of the parasitic npn transistor 135. The parasitic npn transistor 135 thereby may turn ON and dissipate significant current (e.g., 5–10 mA/micron) from the drain to the source of the zero threshold voltage NFET 115. Because of the high well resistance of zero threshold voltage NFETs, the avalanche current required to turn ON the parasitic npn transistor 135 is significantly lower than the avalanche current required to turn ON the parasitic npn transistor of a normal NFET (e.g., an NFET formed with conventional threshold voltage adjusting implants).

With reference to FIGS. 1A and 1B, when an ESD event generates a large positive voltage (e.g., greater than about +3 volts) on the I/O pad 105, the large voltage is applied to the drain of the zero threshold voltage NFET 115. In response thereto, an avalanche current is generated that flows from the zero threshold voltage NFET 115's drain to source. Because the gate bias network 117 and/or the source bias network 119 ensure that the zero threshold voltage NFET 115 remains OFF (e.g., so that no conductivity channel is formed therein), a sufficient voltage potential is generated within the p-type substrate 121 of the NFET 115 to forward bias the base-emitter junction of the NFET 115's parasitic npn transistor 135. Accordingly, in response to the ESD event, the parasitic npn transistor 135 turns ON so as to generate a high current path between the I/O pad 105 and the reference terminal ($V_{SS}$). The ESD event thereby is harmlessly dissipated to the reference terminal ($V_{SS}$).

Figure 2:
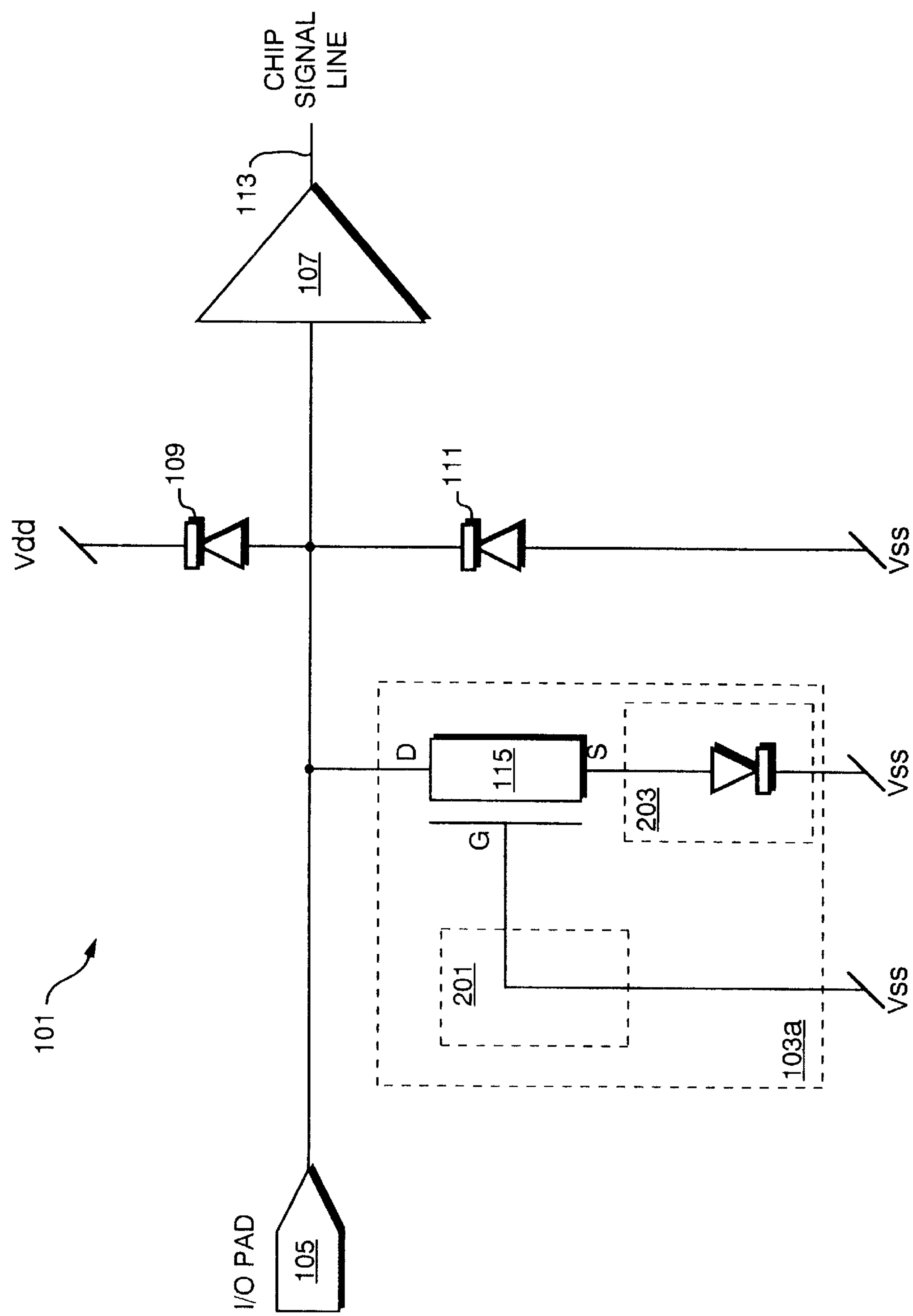
FIG. 2 is a schematic diagram of the integrated circuit chip of FIG. 1A that employs a first embodiment of the inventive ESD protection circuit.

FIG. 2 is a schematic diagram of the IC chip 101 employing an inventive ESD protection circuit 103*a* that represents a first embodiment of the ESD protection circuit 103. In the ESD protection circuit 103*a*, the gate bias network 117 comprises a short circuit to the reference terminal ($V_{SS}$), represented generally as reference number 201, and the source bias network 119 comprises a source diode 203. The source diode 203 preferably comprises an ESD rated diode as is known in the art capable of withstanding the significant current levels dissipated from the I/O pad 105 to the reference terminal ($V_{SS}$) during an ESD event.

In general, the short circuit 201 and the source diode 203 ensure that the zero threshold voltage NFET 115 remains OFF during normal operation of the IC chip 101 (e.g., so that the ESD protection circuit 103*a* does not affect the IC chip 101 during normal operation) and during an ESD event (e.g., so that the parasitic npn transistor 135 may turn ON and dissipate any large voltage present on the I/O pad 105 to the reference terminal ($V_{SS}$)). For example, during normal operation of the IC chip 101, the voltage on the I/O pad 105 will be on average a positive voltage between 0 and 1.8 volts. In response thereto, the voltage on the source of the zero threshold voltage NFET 115 will rise to a positive voltage. However, due to the source diode 203, the maximum voltage above the reference terminal voltage $V_{SS}$ that the zero threshold voltage NFET 115's source may reach is the turn-on voltage of the source diode 203 (e.g., about +0.7 volts) With the gate of the zero threshold voltage NFET 115 held at the reference terminal voltage $V_{SS}$, the gate-to-source voltage ($V_{GS}$) of the zero threshold voltage NFET 115 is held at about −0.7 volts, and the zero threshold voltage NFET 115 is OFF. Similarly, during an ESD event, if the source diode 203 conducts (e.g., due to an avalanche current within the NFET 115), $V_{GS}$ is held at about −0.7 volts, the zero threshold voltage NFET 115 remains OFF and the parasitic npn transistor 135 may turn ON.

Figure 3:
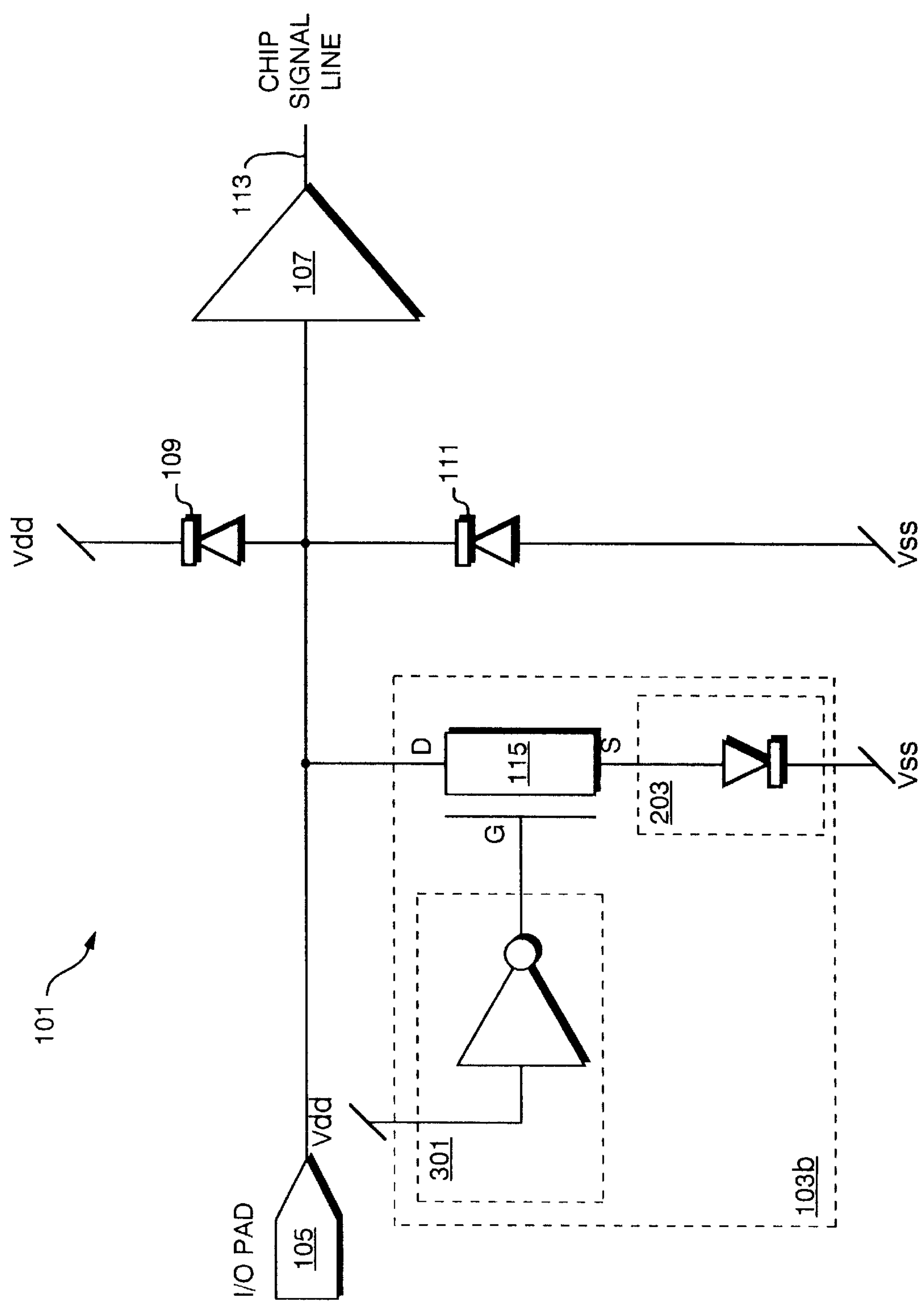
FIG. 3 is a schematic diagram of the integrated circuit chip of FIG. 1A that employs a second embodiment of the inventive ESD protection circuit.

FIG. 3 is a schematic diagram of the IC chip 101 employing an inventive ESD protection circuit 103*b* that represents a second embodiment of the ESD protection circuit 103. In the ESD protection circuit 103*b*, the gate bias network 117 comprises an inverter 301 having an input coupled to the voltage terminal ($V_{dd}$) and an output coupled to the gate of the zero threshold voltage NFET 115, and the source bias network 119 comprises the source diode 203. The inverter 301 maintains the gate of the zero threshold voltage NFET 115 at the reference terminal voltage $V_{SS}$ (in the same manner as the short circuit 201) so that the $V_{GS}$ of the zero threshold voltage NFET 115 is maintained at about −0.7 volts during normal operation. The ESD protection circuit 103*b* thus operates similarly to the ESD protection circuit 103*a* (e.g., by allowing the npn transistor 135 to turn ON during an ESD event). The inverter 301 provides an alternative means of establishing a reference level on the gate of the NFET 115.

Figure 4:
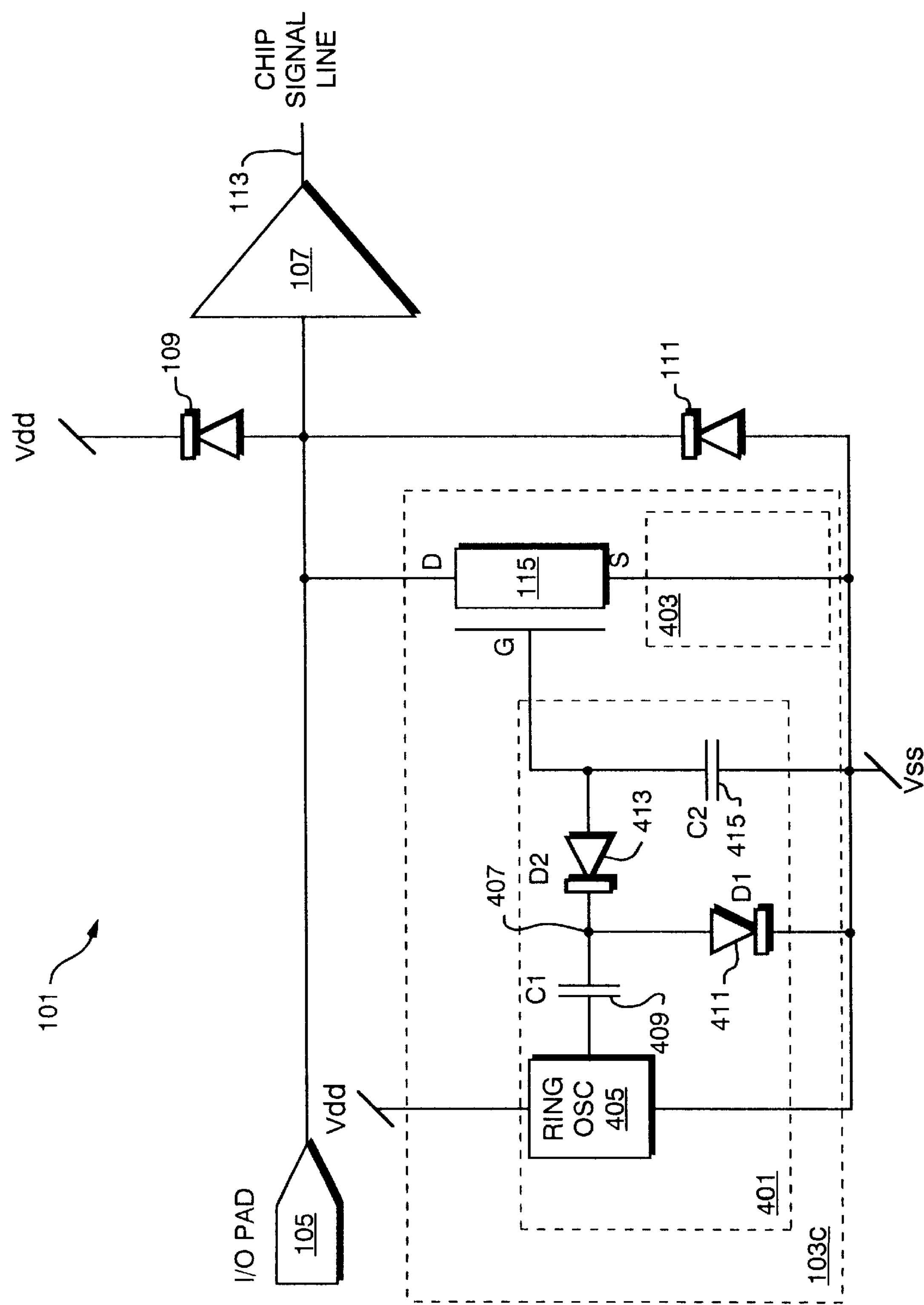
FIG. 4 is a schematic diagram of the integrated circuit chip of FIG. 1A that employs a third embodiment of the inventive ESD protection circuit.

FIG. 4 is a schematic diagram of the IC chip 101 employing an inventive ESD protection circuit 103*c* that represents a third embodiment of the ESD protection circuit 103. In the ESD protection circuit 103*c*, the gate bias network 117 comprises a negative bias generator circuit 401 and the source bias network 119 comprises a short circuit to the reference terminal ($V_{SS}$) (e.g., the source bias network 119 is eliminated), represented generally by reference number 403. The negative bias generator circuit 401 comprises a ring oscillator 405 coupled to the voltage terminal ($V_{dd}$), to the reference terminal ($V_{SS}$) and to a node 407 of the negative bias generator circuit 401 via a first capacitor 409. The negative bias generator circuit 401 further comprises a first rectifier diode 411 coupled between the node 407 and the reference terminal ($V_{SS}$), a second rectifier diode 413 coupled between the node 407 and the gate of the zero threshold voltage NFET 115 and a second capacitor 415 coupled between the gate of the zero threshold voltage NFET 115 and the reference terminal ($V_{SS}$).

In operation, the ring oscillator 405 outputs a free-running AC signal (e.g., preferably having a frequency of about 100 MHZ, although any other frequency may be employed). The AC signal is AC coupled to the node 407 via the first capacitor 409 to remove any DC bias output by the ring oscillator 405. The AC signal at node 407 therefore has an amplitude of about $(V_{dd}-V_{SS})/2$.

The first rectifier diode 411 clips the positive going portion of the AC signal at node 407, and the second rectifier diode 413 and the second capacitor 415 create a negative gate bias (e.g., about $0.5-V_{dd}$ volts) for the gate of the zero threshold voltage NFET 115 based on the negative portion of the AC signal at the node 407. Note that all nodes that carry negative voltages are built in the appropriate wells to isolate the nodes from the substrate 121.

With the gate voltage of the zero threshold voltage NFET 115 held negative and the source of the zero threshold voltage NFET 115 shorted to the reference terminal ($V_{SS}$), the gate-to-source voltage of the zero threshold voltage NFET 115 is held negative, and the NFET 115 is strongly OFF. Accordingly, during normal operation of the IC chip 101 of FIG. 4, the zero threshold voltage NFET 115 is OFF and the ESD protection circuit 103*c* does not affect the operation of the IC chip 101. During an ESD event, the zero threshold voltage NFET 115 remains weakly OFF so that the NFET 115's parasitic npn transistor 135 may turn ON and dissipate any large voltages present on the I/O pad 105 as previously described.

By employing the ESD protection circuit 103 (e.g., the ESD protection circuit 103*a*, the ESD protection circuit 103*b* or the ESD protection circuit 103*c*), a direct path is created between the I/O pad 105 and the reference terminal ($V_{SS}$) for the dissipation of positive voltage ESD events. Because of the high substrate resistance of the zero threshold voltage NFET 115, the drain voltage required to turn ON the NFET 115's parasitic npn transistor 135 (e.g., about 3–7 volts) is reduced significantly from the drain voltage required to turn ON a normal NFET's parasitic npn transistor (e.g., about 8–9 volts). Accordingly, the ESD protection circuit 103 provides excellent ESD protection, especially for low voltage applications.

The foregoing description discloses only the preferred embodiments of the invention, modifications of the above disclosed apparatus and method which fall within the scope of the invention will be readily apparent to those of ordinary skill in the art. For instance, while the ESD protection circuit 103 has been described with reference to a zero threshold voltage NFET, it will be understood that an NFET having only a partial threshold voltage implant may be similarly employed. As used herein, "low threshold voltage FET" means an FET having either no or a partial threshold voltage implant. Further, the ESD protection circuit 103 may be employed with other voltage levels than those described. The short circuit 201, the source diode 203, the inverter 301, the negative bias generator circuit 401 and the short circuit 403 are merely exemplary gate/source bias elements and any gate bias network 117 and/or source bias network 119 that prevents the zero threshold voltage NFET 115 from turning ON may be similarly employed.

Accordingly, while the present invention has been disclosed in connection with the preferred embodiments thereof, it should be understood that other embodiments may fall within the spirit and scope of the invention, as defined by the following claims.

The invention claimed is:

1. A circuit on an IC chip having an I/O pad and I/O circuitry directly coupled to the I/O pad for transmitting and receiving signals over the I/O pad, the circuit comprising:

a low threshold voltage FET coupled to the I/O pad in parallel with the I/O circuitry for protecting the IC chip from an ESD event on the I/O pad;

the FET also coupled to a first voltage terminal for providing a shunting path for the ESD event, thereby effectuating said protecting the IC chip from the ESD event on the I/O pad; and a negative bias generator coupled to a gate of the FET for maintaining the gate at a voltage level below a threshold voltage of the FET thereby maintaining the FET in an off state during normal operation of the IC chip.

2. The circuit of claim 1 further comprising a control circuit coupled between the FET and the first voltage terminal and operating in conjunction with the negative bias generator for maintaining the FET in an off state during normal operation of the IC chip.

3. The circuit of claim 2, wherein the control circuit is selected from the group consisting of a short circuit coupled between the FET and the first voltage terminal and a diode coupled between the FET and the first voltage terminal.

4. The circuit of claim 1 wherein the low threshold voltage FET comprises a low threshold voltage n-channel MOSFET.

5. The circuit of claim 4 wherein the low threshold voltage n-channel MOSFET comprises a zero threshold voltage n-channel MOSFET.

6. The circuit of claim 1 wherein the first voltage terminal comprises a reference terminal.

7. The circuit of claim 1 wherein the negative bias generator comprises:

an oscillator circuit adapted to output an AC signal; and a rectification network coupled to the oscillator circuit and to the gate of the FET, the rectification network adapted to receive the AC signal from the oscillator circuit, to generate a negative voltage based on the AC signal and to bias the gate of the FET with the negative voltage.

8. A circuit on an IC chip having an I/O pad and I/O circuitry directly coupled to the I/O pad for transmitting and receiving signals over the I/O pad, the circuit comprising:

a low threshold voltage FET coupled to the I/O pad in parallel with the I/O circuitry for protecting the IC chip from an ESD event on the I/O pad;

the FET also coupled to a first voltage terminal for providing a shunting path for the ESD event, thereby effectuating said protecting the IC chip from the ESD event on the I/O pad;

a first control circuit coupled to a gate of the FET for maintaining the gate at a voltage level below a threshold voltage of the FET thereby maintaining the FET in an off state during normal operation of the IC chip; and a diode coupled between the FET and the first voltage terminal and operating in conjunction with the first control circuit for maintaining the FET in an off state during normal operation of the IC chip.

9. The circuit of claim 8 wherein the low threshold voltage FET comprises a low threshold voltage n-channel MOSFET.

10. The circuit of claim 9 wherein the low threshold voltage n-channel MOSFET comprises a zero threshold voltage n-channel MOSFET.

11. The circuit of claim 8 wherein the first voltage terminal comprises a reference terminal.

12. The circuit of claim 8 wherein the first control circuit comprises an inverter having an input coupled to a second voltage terminal and an output coupled to the gate of the FET.

13. The circuit of claim 8 wherein the first control circuit comprises a negative bias generator coupled to the gate of the FET.

14. The circuit of claim 13 wherein the negative bias generator comprises:

an oscillator circuit adapted to output an AC signal; and a rectification network coupled to the oscillator circuit and to the gate of the FET, the rectification network adapted to receive the AC signal from the oscillator circuit, to generate a negative voltage based on the AC signal and to bias the gate of the FET with the negative voltage.

15. The circuit of claim 8 wherein the first control circuit comprises a short circuit to the first voltage terminal.

16. The circuit of claim 8 wherein the diode comprises an ESD rated diode.

* * * * *